(12) United States Patent
Ansaldi et al.

(10) Patent No.: US 8,305,222 B2
(45) Date of Patent: Nov. 6, 2012

(54) DEVICE FOR DETECTING AND SIGNALLING MALFUNCTIONS IN THE USE OF ELECTRICAL APPLIANCES

(75) Inventors: Pierluigi Ansaldi, Capannori (IT); Ezio Lazzareschi, Marlia (IT)

(73) Assignee: Pierluigi Ansaldi, Capannori (Lucca) (IT)

( * ) Notice: Subject to any disclaimer, the term of this patent is extended or adjusted under 35 U.S.C. 154(b) by 644 days.

(21) Appl. No.: 12/532,810

(22) PCT Filed: Nov. 23, 2007

(86) PCT No.: PCT/IB2007/003671
§ 371 (c)(1),
(2), (4) Date: Sep. 23, 2009

(87) PCT Pub. No.: WO2008/065516
PCT Pub. Date: Jun. 5, 2008

(65) Prior Publication Data
US 2010/0109888 A1 May 6, 2010

(30) Foreign Application Priority Data
Nov. 30, 2006 (IT) .............................. MI2006A2311

(51) Int. Cl.
*G08B 21/00* (2006.01)
(52) U.S. Cl. ........................ 340/635; 340/573.1; 340/660
(58) Field of Classification Search .................. 340/635, 340/573.1, 636.12–636.17, 641, 649–653, 340/656–660
See application file for complete search history.

(56) References Cited

U.S. PATENT DOCUMENTS

| 4,626,635 | A | * | 12/1986 | Mahon ......................... 200/38 A |
| 4,814,641 | A | * | 3/1989 | Dufresne ....................... 307/326 |
| 2002/0158763 | A1 | * | 10/2002 | Takarada et al. ............ 340/573.1 |
| 2006/0119368 | A1 | * | 6/2006 | Sela et al. ..................... 324/522 |

* cited by examiner

*Primary Examiner* — Daniel Previl
(74) *Attorney, Agent, or Firm* — Lucas & Mercanti, LLP

(57) ABSTRACT

A device for detecting and signaling malfunctions in use of electrical appliances which have a cyclical or a continuous central measuring and processing unit connected to two input/output ports for connecting between a source of electrical power and an electrical appliance respectively. The central unit is connected to at least one signaling element controlled by a malfunction occurrence signal that is processed by the central unit.

16 Claims, 4 Drawing Sheets

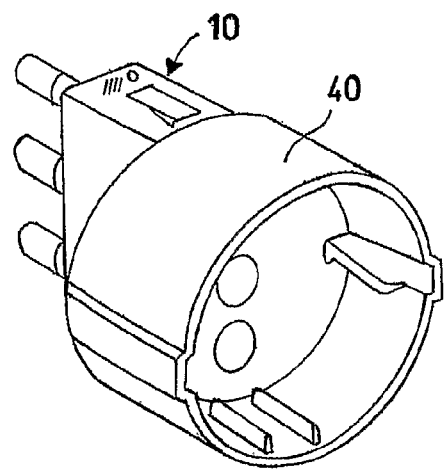
Fig.4
Fig.5
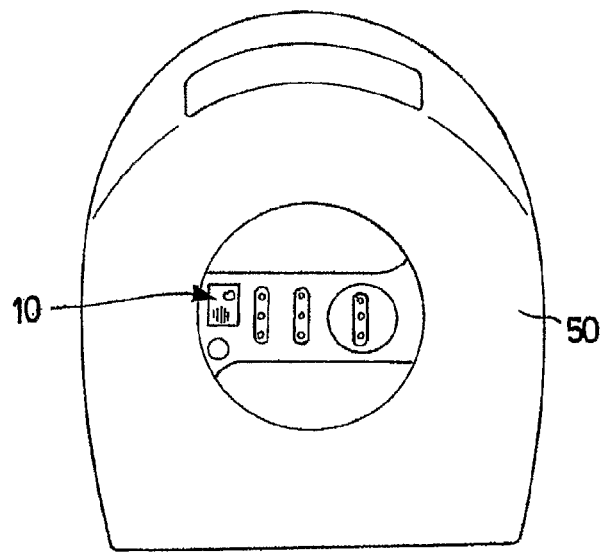
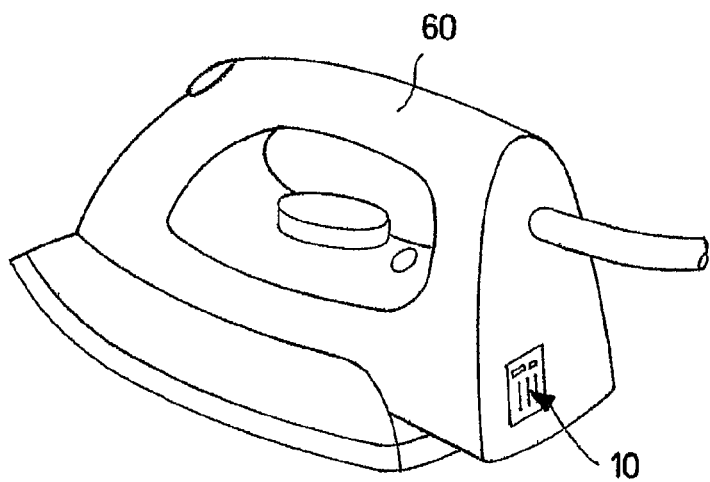
Fig.6

DEVICE FOR DETECTING AND SIGNALLING MALFUNCTIONS IN THE USE OF ELECTRICAL APPLIANCES

CROSS-REFERENCE TO RELATED APPLICATIONS

This patent application claims the benefit of priority from Italian Patent Application No. MI2006 002311 filed Nov. 30, 2006 through PCT Application Serial No. PCT/IB2007/ 003671 filed Nov. 23, 2007, the contents of each of which are incorporated herein by reference.

The present invention refers to a device for detecting and signalling malfunctions in the use of electrical appliances.

In particular, the term electrical appliances indicates all the appliances provided with electrical supply connectable to a source of electrical power such as for example the public power distribution system, as well as continuous or alternating self-sufficient electrical power generating units.

In the daily use of such electrical appliance such as for example household appliances and/or power tools users are generally exposed to high hazards due, in a particular manner, to malfunctions in the appliances themselves or to the conditions of the source of electrical power.

As a Matter of fact, should the electrical appliance connected to the electrical system fail, in fact it is possible that the electric line connects to the metallic body of the appliance, which, if touched can lead to an electric shock, that is an electrical current passes through the human body.

In addition, should the connection to the electric line be unsound, it is also possible that there is heat generated due to the Joules effect thus leading to an outburst of fire.

An example of a particularly hazardous domestic appliance is the iron. As a matter of fact, the use of the iron requires combination of electrical power and water, further increasing electric shock hazards in case of worn out cables or loss of electrical insulation. Though generating high stress on the power supply cord, such device is belongs to the class of simple insulation appliances. Any malfunction in the insulation of such appliances could thus lead to a phase conductor getting into contact with the body causing a current flow trough the protective conductor.

On the contrary, power tools used in construction sites, are designed provided with a double insulation in such a manner that a single malfunction does not expose the operator to contact with hazardous voltage. This is generally obtained by manufacturing the shell of the container with insulating material, or in any case by making sure that the parts subject to electrical voltage are surrounded by a double layer of insulating material or by a reinforced insulation.

The power tools are provided with a double insulation in that they are usually employed under harsh environmental conditions, outdoors and exposed to water in any case. Furthermore, power tools are connected to industrial power supply systems of a three-phase type capable of supplying higher voltage with respect to the domestic power supply. Moreover, even such appliances can be subject to wear-out thus becoming a considerable source of hazard as previously described regarding household appliances.

Analogous hazards can be caused for example by a faulty grounding of an electrical system or by lack of insulation between the phase and the ground. If an electrical system is grounded properly, all the fixed metal structures of a building, among which frames, gates, railings, television antennas and so on, have the same electric potential as the ground. Such measure in particular offers protection against indirect electric shock and protects people, the electrical system as well as the electrical appliances connected in case of lightning or high voltage derived from other factors.

In order to prevent some malfunctions, electrical systems are obligatorily provided with differential switches and magneto-thermal switches. Differential switches are capable of breaking a circuit in case of high leakage towards the ground or loss of insulation between the phase and the ground, whereas the magneto-thermal switches are capable of breaking a circuit in case of overcurrent.

Nevertheless, it is possible that the source of electrical power and/or the electrical appliances have minor malfunctions, not detectable by such switches. Furthermore, they can also be subject to wear-out or failure.

For measuring the supply system parameters, and hence checking its conditions, today there are suitable measuring devices also known as testers, capable of detecting, depending on the specific manufacturing, a particular parameter of the electrical supply such as for example the grounding resistance, insulation, and, in the three-phase systems, the presence, sequence and direction of rotation of the phases.

Such devices are designed to be used by professionals during installation, maintenance or tests on the electrical systems.

Thus, they are hardly commonly used by unskilled operators to check the conditions of the electrical system or of the electrical appliances before connecting them. This in particular, is due to the technical expertise required in order to use and read them, alongside the trouble of having to perform such tests each time the user wants to connect the electrical appliance to the system.

It is the object of the present invention to overcome the drawbacks mentioned above and in particular that of manufacturing a device for detecting and signalling malfunctions in the use of electrical appliances, capable of operating automatically upon connection of the appliance to the source of electrical power or in advance with respect to such connection.

Another object of the present invention is to provide a device for detecting and signalling malfunctions in use of electrical appliances, capable of detecting both malfunctions of the appliance and the malfunctions of the system to which the appliance is connected.

A further object of the present invention is to manufacture a device for detecting and signalling malfunctions in the use of electrical appliances, which are easy to read.

These and other objects according to the present invention are attained by manufacturing a device for detecting and signalling malfunctions in use of electrical appliances as described in claim 1.

Further characteristics of the device are the subject of the sub-claims.

Characteristics and advantages of a device for detecting and signalling malfunctions in the use of electrical appliances according to the present invention shall be clearer from the following exemplifying and non-limiting description with reference to the schematic drawings attached wherein:

FIG. 4 is a first exemplifying embodiment wherein the device according to the invention is an electrical adapter;

FIG. 5 is a second exemplifying embodiment wherein the device according to the invention is applied on an electrical extension cable;

FIG. 6 is a third exemplifying embodiment wherein the device according to the invention is applied on a household appliance;

Figure 1:
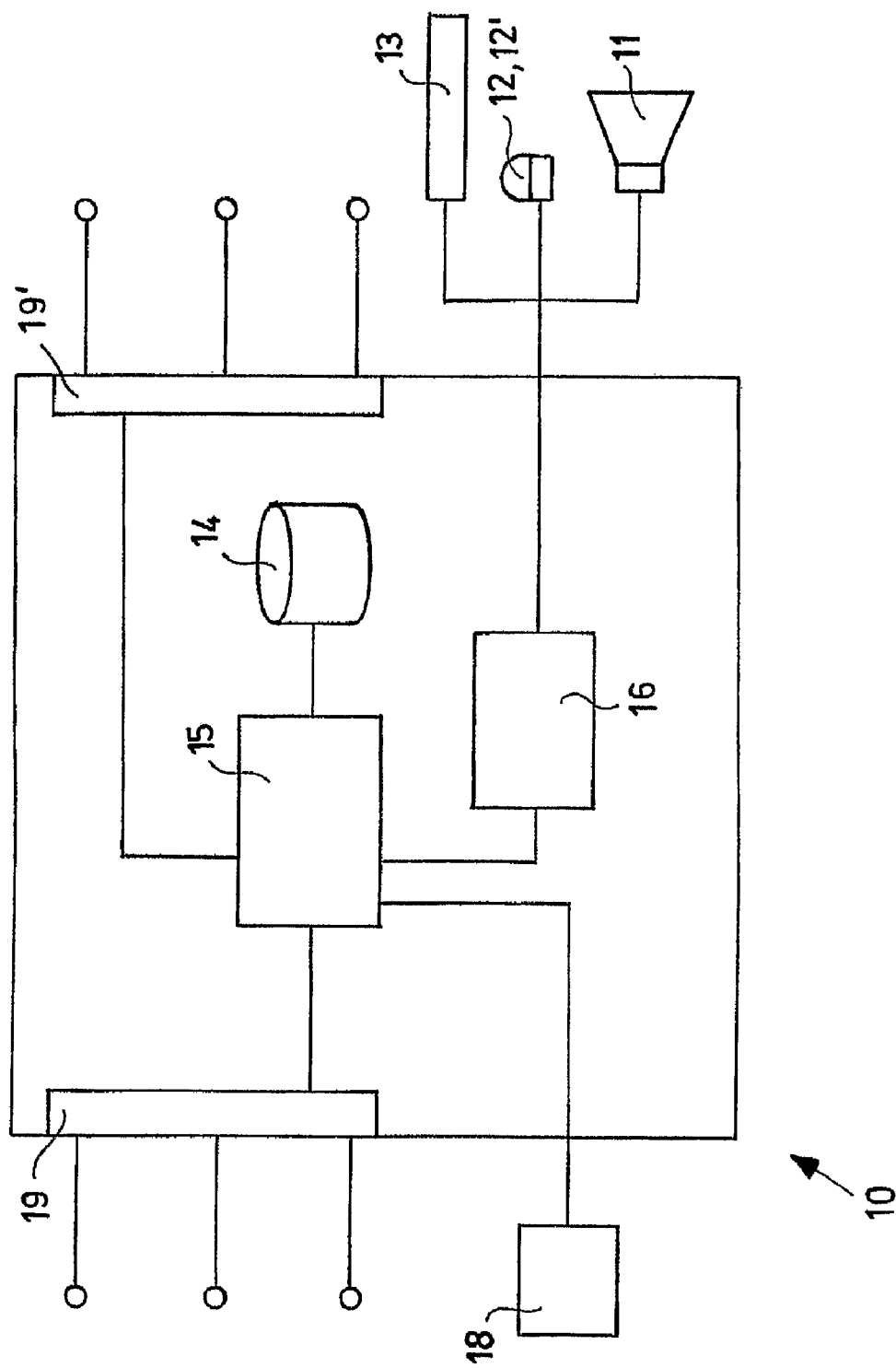
FIG. 1 is a schematic representation of the architecture of the device according to the invention.

With reference to the figures mentioned above, a device for detecting and signalling malfunctions in use of electrical appliances is shown overall indicated by 10. Such device 10 comprises input ports and/or output ports 19, 19', through which the device 10 can be connected to a source of electrical power 20, 20' and to at least one electrical appliance 30, 30', such as for example a household appliance or a power tool.

The input and/or output ports 19, 19' are connected internally to a central measuring and processing unit 15 which determines in a cyclical manner, at preset intervals, the parameters of the source of electrical power 20, 20' and of the electrical appliances 30, 30' to which the device 10 is interconnected, processing them in such a manner to determine the presence of malfunctions and to output a related signal if required.

The central unit 15 can be implemented with electro-mechanical and/or electronic and/or electromagnetic components depending on the specific requirements.

In case of implementation with electronic components, the central unit 15 is further provided with storage means 14. Such storage means 14 store reference values according to which the measured parameters are processed in order to determine the presence or absence of malfunctions.

The central unit 15 is in turn connected to a unit 16 for amplifying the processed signals, which feeds at least one signalling device 11, 12, 12', 13.

Such amplification unit 16 can be preferably made as a relay for example for controlling the power load.

Alternatively, such amplification unit 16 can be made as electronic components or electromagnetic components.

As a signalling device, for example an acoustic signalling device 11 or a visual signalling device such as a diode LED 12, a lamp 12' or an interface 13 for graphic representation of the processed signals is provided.

In order to maintain the easy reading of the device 10 according to the invention, the interface 13 for the graphic representation does not display the values of the measured parameters, which would require special interpretation by the operator, but automatically converts them into alarm messages or messages providing instructions which can be implemented even by unskilled people.

Furthermore, in an advantageous embodiment, there can be provided at least one commands actuation means 18, for example made as a test button, for starting or restarting the processing operation performed by the central unit 15.

Figure 2:
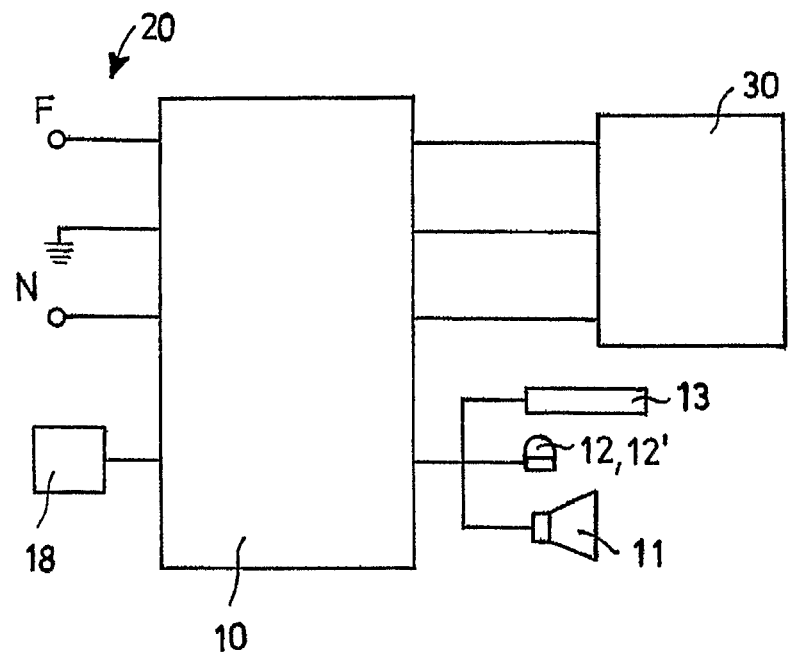
FIG. 2 is a schematic representation of a device according to the invention connected between a single-phase source of electrical power and the load.
Figure 3:
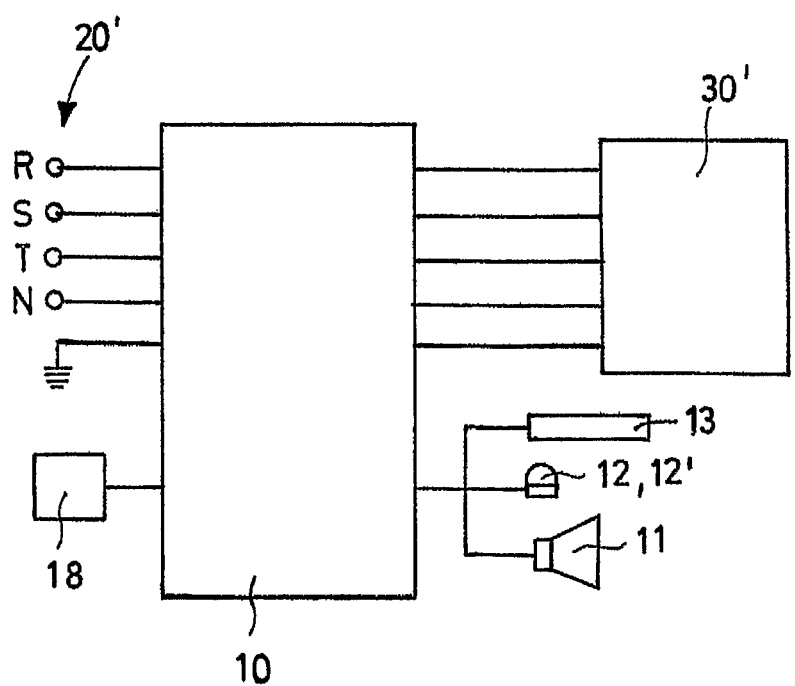
FIG. 3 is a schematic representation of a device according to the invention connected between a three-phase source of electrical power and the load.

The device is generally interconnected between a source of electrical power 20, 20' and at least one electrical appliance 30, 30', as schematically illustrated in FIGS. 2 and 3.

In particular, the device 10 according to the invention can be adapted to detect malfunctions in a three-phase or multiphase system 20' and in at least one related industrial appliance 30'.

Analogously, such device 10 can be used with sources of electrical power supplying continuous or alternating single-phase or multiphase current, up to at least 750 Volts.

As shown in FIGS. 4, 5 and 6, the device 10 according to the invention can be implemented as an independent device, such as for example an adapter 40 or an extension cable 50. In such case, the input and/or output ports 19, 19' shall be implemented according to the corresponding electrical standards, depending on the place of use of the device 10 itself, such as for example the EEC European 7/7 (schuko socket/plug) or the EEC 7/16 (Europlug socket/plug) standards, the CEI 23-16/VII (10 amperes or 16 amperes) Italian standard, the American NEMA standard, the BS British standard and so on.

Otherwise, the device 10 according to the invention can be directly integrated in an electrical appliance 30, 30'. For exemplification purposes FIG. 6 shows an iron in which a device 10 for detecting and signalling malfunctions according to the invention is directly implemented.

Figure 7:
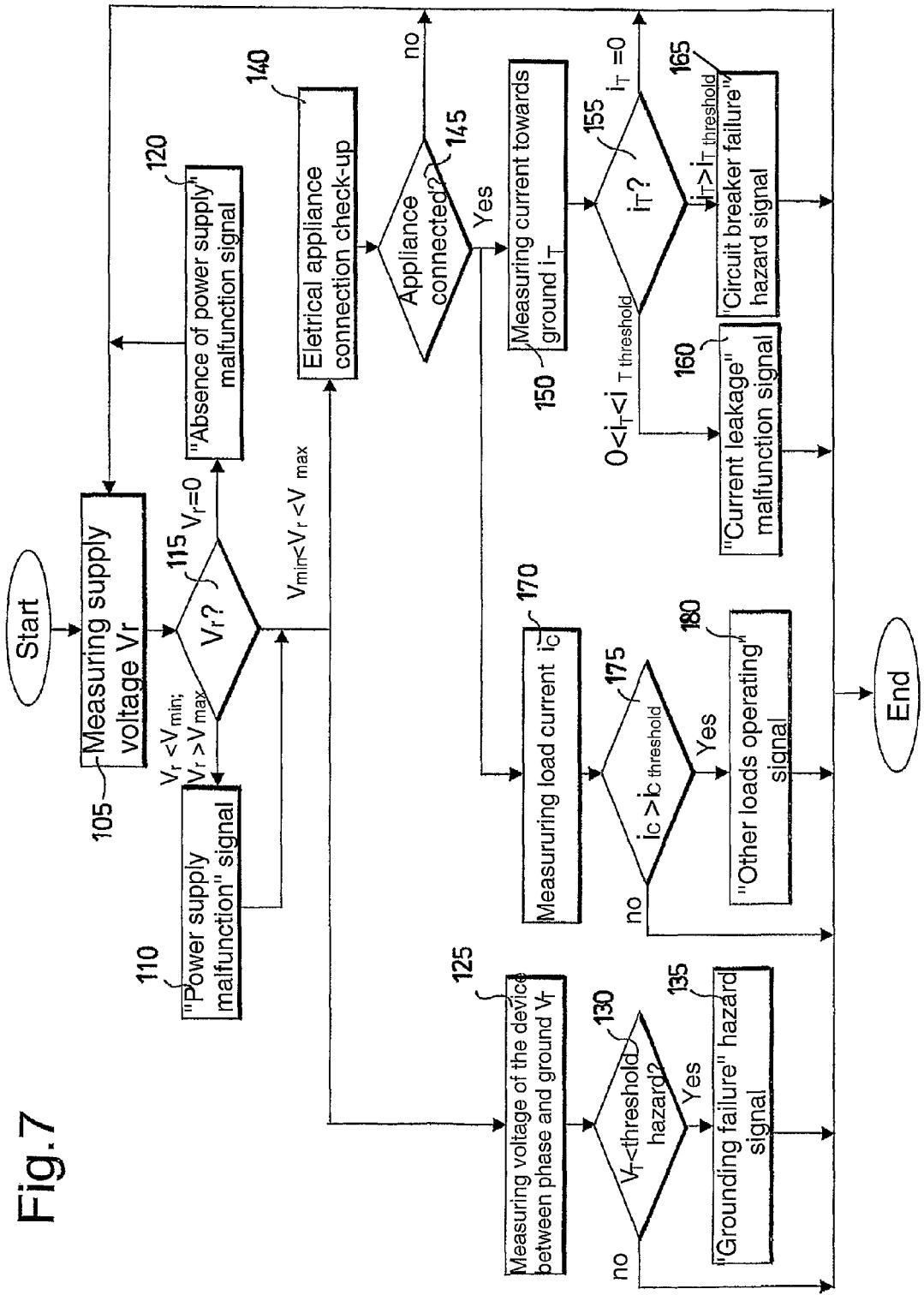
FIG. 7 is a block scheme of the cycle of operation of the device according to the invention.

The device for detecting and signalling malfunctions in the use of electrical appliances, schematically illustrated in FIG. 7, operates as follows.

When the device 10 according to the invention is properly connected to the source of electrical power 20, 20', but no appliance 30, 30' is yet connected, the measuring and processing central unit 15 cyclically performs, at preset time intervals or in real time, a measurement (step 105 and 125) of the supply voltage $V_r$, of the voltage between phase and ground $V_T$ of the device and also of the neutral conductor.

Depending on the measured supply voltage $V_r$, the central unit 15 determines (step 115) the presence of power and, in case, the presence of a malfunction of the same which can be caused by detected voltages being either too high or too low. The normal operation window $[V_{min}/V_{max}]$ of the supply voltage $V_r$ is set during manufacturing depending on the tolerances allowed at the source of electrical power 20, 20'.

In general, advance setting of the reference parameters occurs through dimensioning the electrical and/or mechanical components, in case of a central unit 15 made of electro-mechanical components, or through storage of the reference values in the storage means 14, in case of an electronic central unit 15.

In case of detection of absence of power (step 120) or in case of power malfunction (step 110) the central unit 15 generates a signal which is suitably amplified by the unit 16 and feeds at least one corresponding signalling device 11, 12, 12', 13.

Otherwise, in case of presence of power and if the source of electrical power detected is a three-phase or multiphase system 20', the device preferably performs a check-up operation on the phase sequence of the connected socket.

Depending on the voltage $V_T$ of the device 10 measured between phase and ground (step 130), on the other hand there occurs the signalling of faulty connection of the protective conductor (step 135).

In order for such measurement to be performed under live voltage, it is necessary to perform such operation on the device 10 whose ground pole is connected to the protective conductor of the system.

In such case, there is a proper operation of the system when the voltage between phase and ground $V_T$ measured on the device (10) is present and equivalent to the phase voltage, according to the characteristics of the connected source. Otherwise, a malfunction is determined on the system, in case the voltage between phase and ground $V_T$ of the device (10) is too low or absent.

For signalling faulty connection of the protective conductor, an extremely efficient signalling device 11, 12, 12', 13, that is a device capable, with good chances, to alert a person, is preferably chosen. As a matter of fact, faulty connection of the protective conductor is a sign of a situation of general serious hazard, which requires severe precautions.

In case of a signalling device 10 connected properly even to at least one appliance 30, 30' (steps 140 and 145), in addition to the measurements previously described, the central unit 15 performs the detection of possible current leakages $i_T$ by the appliances 30, 30' towards the protective conductor (steps 150 and 155).

Based on the measured values of leakage current $i_T$, the central unit 15 is able to process and therefore detect the malfunctions described below.

If the current leakages $i_T$ are greater than zero but lower than a hazard threshold value $i_{T,threshold}$ (step 160), these leakages can be for example caused by humidity present in at least one appliance 30, 30' connected to the device 10. It is advisable, in case of related signalling, to disconnect the appliances 30, 30' from the source of electrical power 20, 20', also taking the measures required to solve the cause of malfunction. On the contrary, in case the central unit 15 detects a current leakage $i_T$ exceeding the hazard threshold value $i_{T,threshold}$ (step 165), it indicates the occurrence of a seriously hazardous event, in that such current leakage should generally trigger the intervention of the differential switch. Therefore, the corresponding signalling is a sign of failure or absence of the same differential switch.

Even in this case an extremely efficient signalling device 11, 12, 12', 13, is preferably chosen, in that strict checking operations must be performed as soon as possible on the appliances 30, 30' on the system 20, 20' between which the detection device 10 is connected.

For the detection of the current leakages $i_T$, the central unit 15 is provided with special electro-mechanical, thermal, electronic and/or electromagnetic sensors.

In case of industrial appliances, the signalling described above is connected to the protection equipment used on the power supply lines.

In addition, the device shall signal the absorptions of the connected load $i_c$ exceeding the preset or variable levels $i_{c,threshold}$ (steps 170 and 175) for signalling the start-up of appliances 30, 30' far from the operator using the device itself (step 180).

Lastly, the device can be provided with means of discharge towards the ground of the equivalent currents or currents exceeding the hazard threshold or that of intervention of the differential switches present on the supply line in order to check its operation while checking whether the ground resistance value is at least sufficient to trigger the intervention of the protection devices in case of a failure.

Such means of discharging the current towards the ground can preferably be actuated manually through said commands actuation means 18.

According to the description outlined the characteristics of the device subject of the present invention are clear, as well as the related advantages.

As a Matter of fact, the device for detecting and signalling malfunctions is capable of performing, following connection to a source of electrical power and to a related appliance, an analysis of the pertaining parameters and automatically determine the presence of malfunctions. Thus, professional level technical expertise regarding the parameters of the system is not required for reading the values measured.

Furthermore, following the detection of malfunctions suitable acoustic and/or visual alarms are output, thus allowing even an unskilled person to easily understand the type of malfunction occurring. For example, in a particular embodiment of the device according to the invention, a green diode LED which lights up only in case power is connected is provided. Therefore, it is understandable that, in case such diode fails to light up, a check-up on the conditions of the system is previously required.

Analogously, in case of hazardous malfunctions, for example faulty grounding or insulation, the device is capable of outputting a suitable acoustic and/or visual alarm signal which ceases only upon disconnection of the appliance from the electrical system.

Advantageously, the device according to the invention can be kept interconnected between the source of electrical power and the electrical appliance even when the same is used, thus allowing signalling any occurring malfunctions at any time.

Furthermore, in the embodiment as independent devices 40, 50, there is a wide range of flexibility in use, thus easily allowing connecting the device 10 to any socket of the system 20, 20' and to any appliance 30, 30' the user desires to monitor.

Lastly, it is clear that the device thus conceived is susceptible to various modifications and variants, all falling within the invention; in addition, all details can be replaced by other technically equivalent elements.

Thus, for example a device capable of performing measuring and processing operations of any partial combination of the parameters described can be conceived. In addition, the measuring operations can be performed both in a parallel or sequential manner.

In practice the materials used, as well as the sizes may vary depending on the technical requirements.

The invention claimed is:

1. A device for detecting and signaling malfunctions in electrical appliances, comprising:
   two input/output ports;
   a cyclical or continuous central measuring and processing unit connected to two input/output ports for a connection between a source of electrical power and an electrical appliance;
   at least one signaling means connected to said central measuring and processing unit and controlled by a malfunction occurrence signal processed by said central measuring and processing unit,
   wherein said central measuring and processing unit comprising means for measuring both a plurality of parameters of said source of electrical power and said electrical appliances, and said central measuring and processing unit comprising means for processing the parameters, which are measured, so as to determine malfunctions and to output said malfunction occurrence signal to said at least one signaling means.

2. The device for detecting and signaling malfunctions according to claim 1, wherein said at least one signaling means comprises at least one means selected from a group consisting of:
   acoustic signals;
   light emitting diodes;
   lamps; and
   graphic display interface.

3. The device for detecting and signaling malfunctions according to claim 1, wherein said central measuring and processing unit comprises means for measuring at least one parameter selected from a group consisting of:
   supply voltage;
   voltage between phase and ground;
   current towards the ground; and
   current absorbed by a load.

4. The device for detecting and signaling malfunctions according to claim 3, wherein said means for measuring a plurality of parameters of said source of electrical power and said electrical appliances comprises at least one electro-mechanical and/or thermal and/or electronic and/or electromagnetic current sensor.

5. The device for detecting and signaling malfunctions according to claim 1, wherein said central measuring and processing unit has electro-mechanical components.

6. The device for detecting and signaling malfunctions according to claim 1, wherein said central measuring and processing unit has electromagnetic components.

7. The device for detecting and signaling malfunctions according to claim 1, wherein said central measuring and processing unit has electronic components.

8. The device for detecting and signaling malfunctions according to claim 7, wherein said central measuring and processing unit comprises storage means.

9. The device for detecting and signaling malfunctions according to claim 1, wherein said central measuring and processing unit is connected to at least a commands actuation means which can be actuated from the outside.

10. The device for detecting and signaling malfunctions according to claim 9, further comprising means for discharging current towards a ground, which can be actuated through said at least one commands actuation means.

11. The device for detecting and signaling malfunctions according claim 1, further comprising an amplifying unit between said central measuring and processing unit and said at least one signaling means.

12. The device for detecting and signaling malfunctions according to claim 11, wherein said amplification unit comprises relays, electronic components or electromagnetic components.

13. The device for detecting and signaling malfunctions according to claim 1, wherein said two input/output ports are a plug and a socket, and said two input/output ports are manufactured according to at least one national or international electrical standard.

14. An electrical appliance that is connectable to a source of electrical power supplying continuous, or alternating single-phase or alternating multiphase voltage, wherein said electrical appliance comprises a device for detecting and signaling malfunctions according to claim 1.

15. A method for detecting and signaling malfunctions in use of electrical appliances implemented by a device for detecting and signaling malfunctions in electrical appliances which comprises two input/output ports, a cyclical or continuous central measuring and processing unit connected to two input/output ports for a connection between a source of electrical power and an electrical appliance, and at least one signaling means connected to said central measuring and processing unit and controlled by a malfunction occurrence signal processed by said central measuring and processing unit, wherein said central measuring and processing unit comprises means for measuring both a plurality of parameters of said source of electrical power and said electrical appliances, and said central measuring and processing unit comprise means for processing the parameters, which are measured, so as to determine malfunctions and to output said malfunction occurrence signal to said at least one signaling means, the method comprising the following steps:

a) checking for proper connection of said device to the source of electrical power;

b) measuring the supply voltage and sending
a signal of absence of power, in case the supply voltage measured is equivalent to zero;
a signal of supply malfunction, in case the supply voltage measured is greater than a maximum preset threshold or lower than a minimum preset threshold;

c) measuring the voltage between phase and ground of the device and sending a hazard signal, in case the measured voltage between phase and ground is lower than a preset hazard threshold or absent;

d) checking for the proper connection of said device to an electrical appliance, and in case of proper connection, measuring the current leakage towards the ground and sending:
a malfunction signal, in case the current towards the ground measured is greater than zero but lower than a preset threshold current;
a hazard signal, in case the current towards the ground measured is greater than said threshold current; and e) in case the electrical appliance is connected properly, measuring the load current and sending an alarm signal, in case the load current measured is greater than a preset threshold level.

16. The method for detecting and signaling malfunctions in use of electrical appliances according to claim 15, wherein said method comprises the step of checking the sequence of the phase of the connected socket, in case said source of electrical power is a three-phase or multiphase system.

\* \* \* \* \*